US009143163B2

(12) United States Patent
Grinblat

(10) Patent No.: US 9,143,163 B2
(45) Date of Patent: *Sep. 22, 2015

(54) METHOD AND SYSTEM FOR TEXT COMPRESSION AND DECOMPRESSION

(71) Applicant: Zinovy D Grinblat, Medford, MA (US)

(72) Inventor: Zinovy D Grinblat, Medford, MA (US)

( * ) Notice: Subject to any disclaimer, the term of this patent is extended or adjusted under 35 U.S.C. 154(b) by 31 days.

This patent is subject to a terminal disclaimer.

(21) Appl. No.: 14/047,973

(22) Filed: Oct. 7, 2013

(65) Prior Publication Data

US 2014/0180679 A1   Jun. 26, 2014

Related U.S. Application Data

(63) Continuation-in-part of application No. 11/789,081, filed on Apr. 24, 2007, now Pat. No. 8,332,209.

(51) Int. Cl.
*G06F 17/21* (2006.01)
*H03M 7/30* (2006.01)

(52) U.S. Cl.
CPC .................................. *H03M 7/3084* (2013.01)

(58) Field of Classification Search
USPC ........................................................ 704/7–10
See application file for complete search history.

(56) References Cited

U.S. PATENT DOCUMENTS

| 5,293,164 | A | * | 3/1994 | Bugajski et al. | 341/51 |
| 5,526,407 | A | * | 6/1996 | Russell et al. | 379/88.01 |
| 5,701,459 | A | * | 12/1997 | Millett et al. | 1/1 |
| 5,717,912 | A | * | 2/1998 | Millett et al. | 707/693 |

* cited by examiner

*Primary Examiner* — Leonard Saint Cyr
(74) *Attorney, Agent, or Firm* — Larisa Migachyov

(57) ABSTRACT

The present invention is to provide a method and system for compression and decompression text comprising: creating a redundant universal permanent reference vocabulary which include commonest symbols utilized by all application, and symbols found in thousands of books, specific, professional vocabularies and is created in advance of any information processing, own vocabulary containing during process of text compression and decompression wherein the own vocabulary includes words and symbols e.g. slangs are found in written conversation between persons; splitting the universal vocabulary into a root of tree symbol/index and main symbol sections; creating a first temporary vocabulary; wherein the first temporary vocabulary includes commonest symbol/index utilizing by all applications, root of tree word/index section, and merging index table section to words content in specific vocabulary section; creating a second temporary vocabulary for repeating symbols found in the source text and not found in the first temporary vocabulary; creating pseudo-code by merging an indicator with root of tree or main indexes.

8 Claims, 2 Drawing Sheets

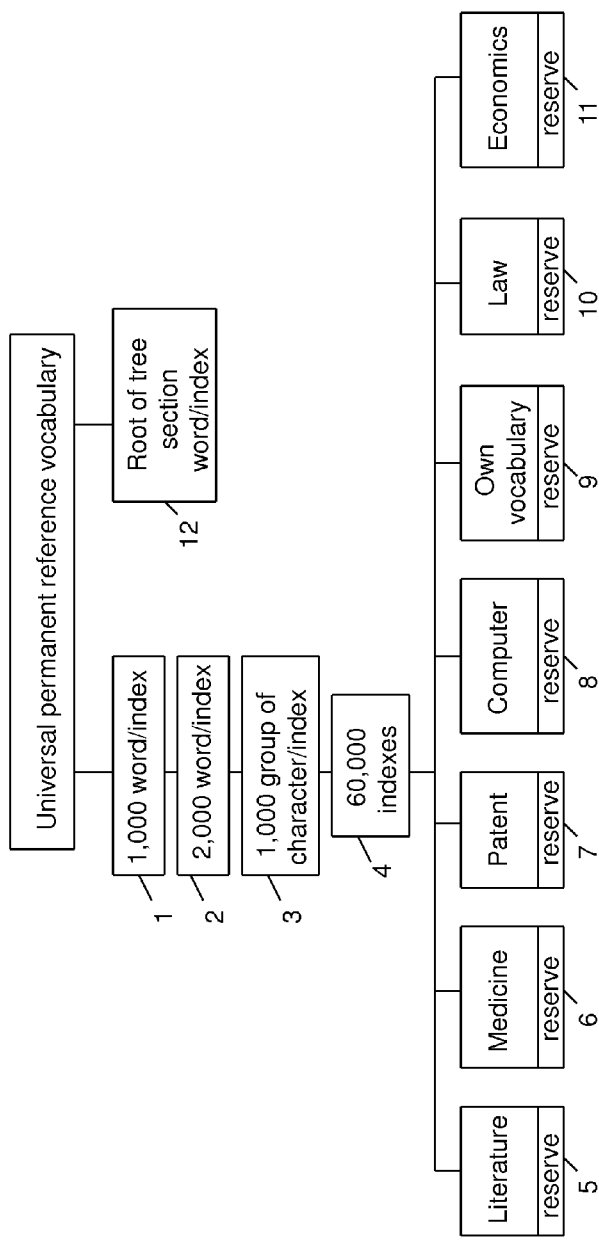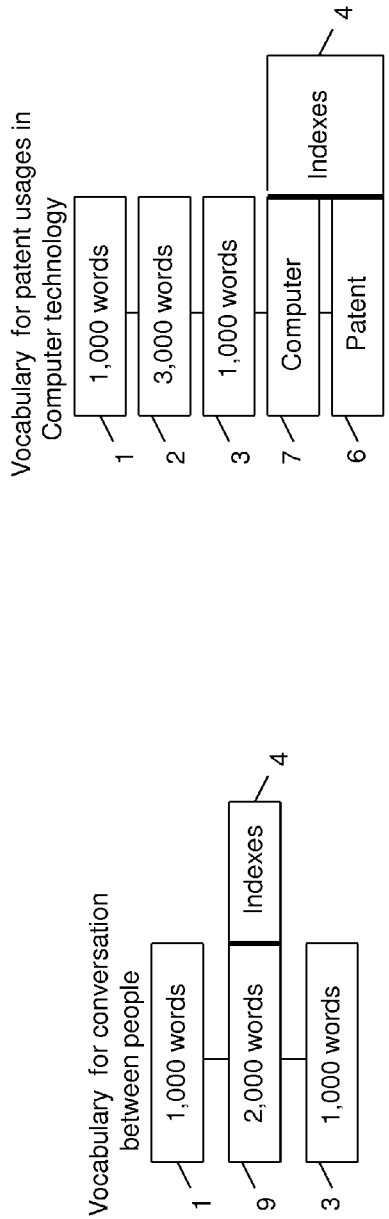

METHOD AND SYSTEM FOR TEXT COMPRESSION AND DECOMPRESSION

REFERENCES CITED

U.S. Patent Documents

| | | |
|---|---|---|
| 5,546,575 | August 1996 | Potter et al |
| 5,701,459 | December 1997 | Millett et al. |
| 5,913,209 | June 1999 | Millett |
| 7,143,294 | November 2006 | Johnson |
| 8,073,139 | December 2011 | Vanstone, et al. |
| 8,332,209 | December 2012 | Grinblat |
| 2004/022497 | November 2004 | Callahan |
| 2005/0198070 | September 2005 | Lowry |

[1] D. Huffman, "A Method for the Construction of Minimum Redundancy Codes," in Proc. IRE, vol. 40, no. 9, pp. 1098-1101, 1952

[2] Gonzalo Navarro and Mathieu Raffinot. A General Practical Approach to Pattern Matching over Ziv-Lempel Compressed Text. Proc. CPM'99, LNCS 1645, 1999

[3] J. Ziv, A. Lempel, "A universal algorithm for sequential data compression", IEEE Transactions on Information Theory, May 1977, Volume: 23 Issue: 3, pp: 337-343

[4] J. Ziv and A. Lempel. Compression of individual sequences via variable length coding IEEE Trans. Inform. Theory, 24:530-536, 1978

[5] U. Khurana "Text compression and Superfast Searching"

[6] Generation Text Retrieval Systems", IEEE Computer 33(11):37-44 (cover feature), November 2000

[7] Md. Azad, Rezwana Sharmeen, Shabbir Ahmad, S. M. Kamruzzaman "An Efficient Technique for Text Compression", September 2010

[8] Fips pub 140-1, security requirements for cryptographic modules, January 1994

BACKGROUND OF THE INVENTION

1. Field of the Invention

The invention relates to the field of compression and decompression of text.

2. Description of the Prior Art

Compression algorithms, such as Huffman, LZ78, LZW and hundreds of other variants of the above techniques usually exploit statistical redundancy of the English letters and give limited compression rate, which was formulated by Claude E. Shannon. According to the Claude E. Shannon's theory of data compression there is a fundamental limit (entropy rate) to lossless data compression. Shannon has been able to estimate for the general model (by using a prediction method) that the entropy rate of the English text can in theory reach 2.3 bits/character. None of the proposed above compression algorithms can provide results as theorized in the Cannon's third-order statistical distribution of English text entropy rate, with the obtainable limit reaching 2.77 bits/character. There were a lot of techniques proposed to increase the compression rate (absolute number) or compression ratio (relative number), e.g. a word-based Huffman coding, where, the table of symbols in the compression coder becomes the text vocabulary; or an Efficient Optimal Recompression; or a Semi-lossless Text Compression; or a Programmed selection of common characters and pairs; or a Programmed selection of prefixes and suffixes; or the method of compression text proposed by U. Khurana "Text compression and Superfast Searching;" [5] based on sequentially converting words of source text into 16 high bit length indexes. For the method of compression text proposed by U. Khurama it is impossible to increase compression ratio because of limitation up to 65,536 words contained in the permanent reference vocabulary by means limitation to build vocabulary symbols as phrases, punctuations, and words and mark combinations. Compression techniques involve trade-offs between various factors, such as the complexity of the designs of data compression/decompression schemes, the ability to search a compressed text in the system without decompressing it, the speed of an operation system, the consumption of expensive resources (i.e. storages and transmission bandwidth), the compression capability, the time it takes to compress information, the user's computer power, the cost of text compression due to the text coding and decoding as well as other factors. None of the methods satisfy the requirement of efficient compression and decompression of text. Furthermore, the methods have both advantages and disadvantages of implementation of different kinds of applications e.g. the requirement of reducing time of text decompression and reducing the working frequency of a microprocessor of an electronic rider. The present invention tries to resolve some restrictions of the systems and apparatuses, which are involved in the process of coding/decoding, storing, and transmitting of text. Furthermore, the present method of converting any symbols into indexes permits to increase the compression ratio of the stored text, to increase the compression rate of the transmitted text, and to reduce the cost of the receivers.

In parent U.S. Pat. No. 8,332,209 ('209) of the "Method and system for text compression and decompression" discloses of compression text by creating the "permanent reference vocabulary" wherein the "permanent vocabulary is a redundant vocabulary including words, word combinations, and word and punctuation combinations"; splitting the permanent vocabulary into various functional sections, such as section 1—with most common usable words, section 2—nouns, section 3—verbs, section 4—adjectives . . . "; and creating the temporary vocabulary, wherein "the functionality of the temporary vocabulary is to convert high bit length indexes belonging to the permanent vocabulary into low bit length indexes presented in the temporary vocabulary, which are then used to create pseudo-code."; "splitting a temporary vocabulary into two sections, which include a root of tree section and a main section." Also discloses techniques for implementation of text compression and decompression such as "creating pseudo-codes; arranging the pseudo-codes for storage and transmission."

Below demonstrates features and advantages for the method of text compression and decompression.

SUMMARY OF INVENTION

In the present invention is to provide a redundant universal permanent reference vocabulary (universal vocabulary) which includes parts such as a redundant vocabulary with symbols taken from thousands of books, articles, professional vocabularies and is created in advance of any information processing.

Another object of the present invention is to provide an own vocabulary with symbols e.g. slangs taken from written conversation between two persons, group of people, between people in an organization, and is created during process of text compression and decompression.

Still another object of the present invention is to provide a reduction size of the universal vocabulary utilizing for specific applications wherein, reduction size of the universal vocabulary comprises step of a creating a first temporary vocabulary by merging index section stored in the universal vocabulary with words presented in the specific vocabulary.

Still another object of the present invention is to provide a reduction size of the universal vocabulary utilizing for specific applications wherein, reduction size of universal vocabulary comprises step of creating a first temporary vocabulary by merging a randomly index Table with words presented in the specific vocabulary.

Still another object of the present invention is to provide of splitting the universal vocabulary into root of tree symbol/ index and main symbol sections.

Still another object of the present invention is to provide a second temporary vocabulary which includes repeating indexes found in the source text and not found in the universal vocabulary.

Still another object of the present invention is to provide a pseudo-code which is a composition of an indicator and root of tree symbol's index. Wherein, at least one bit length indicator defined numbers of main symbol's index appended to the root of tree symbol's indexes.

Still another object of the present invention is to provide a pseudo-code which is a composition of an indicator and main symbol's index. Wherein, one bit indicator defined by the root of tree symbol's index.

Still another object of the present invention is to organize symbols presented in each section of universal vocabulary: In alphabetic order; lengths of characters belong to symbol; quantity of spaces and punctuation marks; and word itself either unique group of characters (letters) taken from this word.

Still another object of the present invention is to provide search of symbols in the universal vocabulary based on the follow rules: Alphabetic order; lengths of characters belongs to symbol; quantity of spaces and punctuation marks; and/or unique groups of characters.

In the present invention "symbol" means letter, word, phrase, number, sentence, punctuation mark, prefix, suffix, and permanently or temporarily made words combinations; "Index" means an address of the symbol located in the permanent and temporary vocabularies. "Code" means command to perform operations with data. Transmitter and Receiver sides mean the following devices: desktop, laptop, smart phone, cell phone, I-phone, I-pod, e-book, payment card and any other devices which at least include microprocessor, memory, monitor, and keyboard.

The features and preferences of the present method and system based thereon will be apparent from the following description and from accompanying drawings.

BRIEF DESCRIPTION OF THE DRAWINGS

FIG. 1 illustrates architecture of the universal permanent reference vocabulary.

FIG. 2 illustrates a vocabulary block diagram for patent usages in computer technology.

FIG. 3 illustrates a vocabulary block diagram for written conversation between people.

DESCRIPTION OF THE PREFERRED METHOD AND SYSTEM

Figure 4:
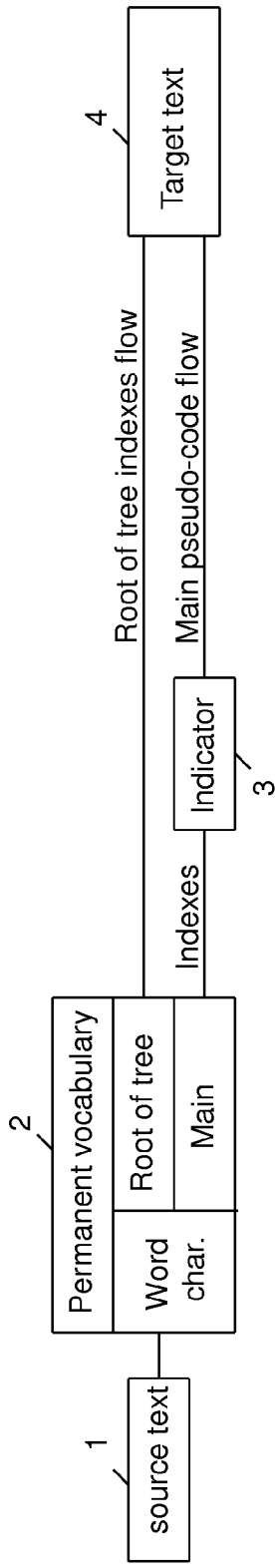
FIGS. 4 and 5 illustrate flowcharts for text compression.

In the present invention creates a universal vocabulary which includes several sections of symbols taken from thousands of books, articles, dictionary, papers, TV, and magazines, and is created in advance of any information processing and base on statistics of the Oxford English Corpus (OEC) [8], wherein OEC resumed that 100, 1,000 and 7,000, 50,000, and more 1,000.000 English words found in writing around the world are covered 50%, 75%, 90%, 95%, and 99% of content in OEC and Sitton Spelling Sourcebook Series by Egger Publishing, Inc. resumed that the first 100 words appear in 50% of adult and student writing, and the first 1,000 words are used in 89% of everyday writing.

Base on this statistics in the present invention creates symbol as a composition of most frequently used function words like 'a', 'of', 'the', 'that' and of most frequently used main words. For example, frequently used word 'woman' combined with words, punctuation marks and spaces such as 'woman, with'; 'to the woman in the'; '. The woman in the'. Its combination of words, punctuation marks and spaces represents by one symbol in the permanent reference vocabulary. The created symbols only for the word, such as, 'woman' will add up about hundreds more quantities and increased value of vocabulary. Thus, the redundant permanent reference vocabulary includes more than 1,000,000 (21 bit length) words and symbols and is built as universal vocabulary which services all of the applications. The symbols, created in advance, stores in the root of tree or main vocabulary sections.

All symbols presented in the universal vocabulary are organized: In the alphabetic order; symbol length; spaces belonging to symbol and punctuation marks; and word itself either unique group of characters (letters) taken from this word.

Thus, symbols search in the universal vocabulary based on the following rules: Alphabetic order; symbol length; quantity of spaces and punctuation marks belonging to symbol; and/or unique groups of characters.

For words not found in the universal vocabulary will be created composition of group of characters which are substitutions for these words.

In the present invention is to provide a reduction size of the universal vocabulary utilizing for specific applications wherein, reduction size of the universal vocabulary comprises step of a creating a first temporary vocabulary by merging index section stored in the universal vocabulary with words presented in the specific vocabulary; a reduction size of the universal vocabulary utilizing for specific applications wherein, reduction size of the universal vocabulary comprises step of creating a first temporary vocabulary by merging a randomly index Table section with words presented in the specific vocabulary sections; splitting the universal vocabulary into main symbol sections and root of tree symbol/index section.

In the present invention is creating Own vocabulary e.g. symbols, slangs and idioms taken from written conversation between two persons, group of people, people to organization, and is created during process of text compression and decompression. In average the people regularly utilizes about two-three thousand words during written conversation e.g. transmitting/receiving of email messages. It means that individual permanent reference vocabulary for each person (OWN vocabulary) will be about twelve bit length (4096 words). For example, reduces index length of the universal vocabulary from 21 bit to 12 bit permits to increase compression ratio to about 18%.

In the present invention creates a pseudo-code such as a composition of indicator and index. For example, pseudo-code includes two bit length indicator that merges with root of tree symbol's index, wherein two bit indicator defines quantities of symbol's indexes from main vocabulary will be appended to the root of tree symbol's indexes, such as 00 10110110; 10111001101101, in which first of ten bit length pseudo-code includes two bits 00 length indicator and eight bits root of tree symbol's index and will be appended by fourteen bit length of main symbol's index.

In the another example as 10110110; 01111101; 1 011101100101010; 10111011001010101; 0 111011001010101 the first and second root of tree symbol's indexes is eight bit length with appended three of 16 bit length main symbol's pseudo-codes which includes one bit indicator and 15 bit length symbol's index. The state 1 of the indicator in the second and third pseudo-codes tell us that two of 15 bit length main symbol's indexes belong to first root of tree symbol's index. The state 0 of the indicator in the third pseudo-code defines that 15 bit length main symbol's index appended to a second eight bit length root of tree symbol's index. The length and place of the indicator is determined by analyzer (not shown). Its analyzer counts quantities of indexes in the root of tree and main sections and makes a decision based on less spending bit indicators quantity and index bit length.

In the present invention is creating codes wherein code: Represents number of merging root of tree symbol's indexes; represents 8-12 bit length root of tree symbol's index; represents 12-16 bit length main symbol's indexes; represents command for outputting repeating index into the second temporary vocabulary. Wherein a second temporary vocabulary creates for repeating symbols found in the source text and not found in the vocabulary comprising: find symbols in the source text, counting of group of repeating symbols not found in the vocabulary, converting symbols into indexes through vocabulary; add code to a first appearing group of repeating indexes in the source text; output group of repeating indexes into the second temporary vocabulary; assign new index to the group of repeating indexes.

The present invention provides a computer system. The computer system includes: microprocessor; counter; storages for storing common words/index section, root of tree symbols section, special main symbols section; index section; temporary file for a source text content; temporary file for a first vocabulary content; temporary file for a second vocabulary content; storage for storing a compressed text content; temporary files for processing a compression and decompression text; storage for non-transitory computer readable media storing the program, wherein the program instructs a processor to perform the method for text compression and decompression.

FIG. 1 illustrates architecture of the universal vocabulary. In this embodiment main vocabulary includes several sections, such as section 1 of 1,000 most frequently used English words with associated indexes; section 2 of 2,000 most frequently used English words with associated indexes; section 3 of 1,000 groups of 2-4 characters (letters) with associated indexes; section 4 of 60,000 indexes which temporary merges to sections 5-11; section 5 of Literature (symbols and words are taken from thousand of books, magazines, and articles); section 6 of Medicine symbols; section 7 of Patent symbols; section 8 of Computer technology symbols; section 9 of Own vocabulary; section 10 of Low symbols; section 11 of Economics symbols. Each section has reserved spaces for new symbols. The vocabulary value depends on applications and may additionally include, for example, sections, such as math, physical, chemical, economical, law, mechanical, geography, science, office, sports, food, recipes, names, countries, cities, and other specific and professional dictionaries. In the present invention the word in the English language as US and UK is presented by the same corresponding index. Also the universal vocabulary may include Native (any foreigner's languages such as French, Spanish, Italian, etc.) vocabularies.

The present universal reference vocabulary is a redundant vocabulary. But value of vocabulary words in the source text varies and depends on different applications. For example, reading hundreds vocabulary words in E-mails, or reading a book like "Jane Eyre", Charlotte Bronte which containts 12,662 vocabulary words. It is a reason to reduce vocabulary size based on the needs of different applications. The present invention utilized the creation a first temporary vocabulary to reduce vocabulary size for particular application. The first temporary vocabulary includes the following sections: commonest symbol/index section utilizing by all applications, root of tree word/index section, and merging a specific main symbol section of the universal vocabulary with index table section. Its method of reduction size of the redundant universal vocabulary permits to lower vocabulary value, for example, from 21 bits (2,000,000 words) to about 12-16 bits (4,000-65,000 words) and to cover text to about 99%. The practical usages of the first temporary vocabulary are demonstrated in FIG. 2 and FIG. 3. Referring to FIG. 2, the first temporary vocabulary for patent usages in the computer technology contains section 1, 2 of most common English words, section 3 of groups of characters (for words not found in the universal vocabulary), index section 4 which merge to words in sections 7 and 8 of patent and computer technology, section 12 of root of tree symbol with associated indexes.

Another example for reducing vocabulary size is creation the first temporary vocabulary during written conversation between persons. Referring to FIG. 3, the first temporary vocabulary for written conversation between persons contains section 1 of 1,000 commonest English words, section 9 of 2,000 words of Own vocabulary, section 3 of words not found in the universal permanent reference vocabulary, section 4 of indexes merge to words in section 9, and root of tree symbol/index section 12 which is typically exploit 8-12 bits length indexes (256-4,096 symbols).

FIG. 4 illustrates flowchart for text compression. Where: source text in the form of characters 1; permanent vocabulary 2; indicator 3; storage for compressed targeted text 4. In the storage 4 stores sequence of root of tree and main indexes. In this embodiment the process of text compression includes the following steps: convert the source text in the form of characters 1 into corresponding indexes through the universal vocabulary 2; separate indexes to root of tree and main sections; create pseudo-codes for main indexes by combining the indicator 3 with main word's index; store sequence of root of tree indexes and sequence of pseudo-codes in the storage 4.

The preferred embodiment of text compression described in detail by following steps:

Prepare source text for processing.

1. Initialize temporary files 1-4, 6. Initialize temp file 7. Set Code=248
2. Initialize indicator's flag: If the symbol read from the root of tree then indicator=1, if the symbol read from the first temporary vocabulary then indicator=0.
3. Reserve first space in the file 5 for code which represents bit length indexes of root of tree section defined by analyzer
4. Reserve first space in the file 6 for pseudo-code which represents bit length indexes of main vocabulary section defined by analyzer
5. Read word's entry in source text file 1 until End Of Source text
6. Find symbol in root of tree section of first temporary vocabulary (file 2) and in main section of first temporary vocabulary (file 3).
6.1 If first symbol found in root of tree section of universal vocabulary then
6.1.1 indicator flag 1

6.2 If first symbol found in main section of first temporary vocabulary then
6.2.1 indicator flag 0
6.3 If next symbol found in root of tree after main section of first temporary vocabulary symbol then
6.3.1 If indicator was 1 change from 1 to 0
6.3.2 If indicator was 0 change from 0 to 1
6.4 If next symbol found in main section of a first temporary vocabulary after main section symbol then
6.4.1 Do not change the indicator flag value; keep it as previous one until the next root of tree symbol read
7. Find symbol's index
7.1 If symbol from root of tree section of first temporary vocabulary follows symbol from Main first temporary vocabulary section then
7.1.1 Count number of the root of tree symbols N=N+1
7.1.2 Output 7 to root of tree index storage section 5 and Go to 5
7.2 If root of tree symbol follows root of tree symbol then
7.2.1 Count number of the root of tree sequential symbols: N=N+1
7.2.2 If N=2
7.2.2.1 Read first code in temporary file 7
7.2.2.2 Output 7.2 to root of tree index section of storage 5
7.2.3 If N>2
7.2.3.1 Increment code by 1 and find code from temporary file 7
7.2.3.2 Read code (N) from temporary file 7
7.2.3.3 Output code and 7.2 to root of tree index section of storage 5
7.2.4 Reset counter of the root of trees sequential symbol to 0 and Go to 5
7.3 If symbol found in main section of first temporary vocabulary follows root of tree symbol then
7.3.1 Make pseudo-code by merging indicator 6.1.1 or 6.3 to index 7
7.3.2 Output 7.3.1 to main pseudo-code storage 6 and Go to 5
7.4 If symbol found in main section of first temporary vocabulary follows main section symbol then
7.4.1 Make pseudo-code by merging indicator 6.4.1 to index 7
7.4.2 Output 7.3.1 to main pseudo-code storage 6 and Go to 5
7.5 If symbol not found in root of tree and in main sections of first temporary vocabulary
7.5.1 Split unknown symbol into parts
7.5.2 Find symbol index for each part 7.5.1 in group of character/index section of first temporary vocabulary until end of symbol
7.5.2.1 Make pseudo-code by merging indicator 6.3 to index 7.5.2
7.5.2.2 Output 7.5.2.1 to main pseudo-code storage 6 and Go to 7.5.2
7.5.3 Go to 5

Figure 5:
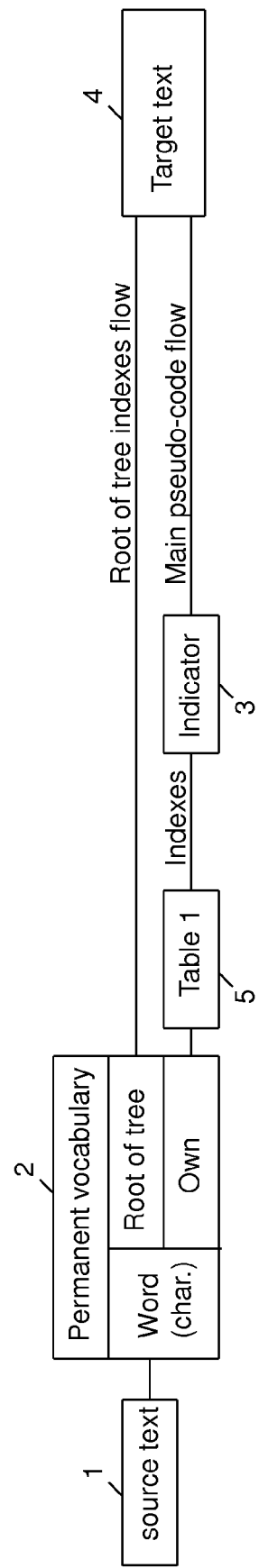

Another example of text compression which is utilization of the universal vocabulary for written conversation between two persons can be seen on FIG. 5. Referring to FIG. 5, the source text in the form of characters 1; universal vocabulary 2; indicator 3; storage for compressed target text 4; and tables 1a, 1b, 2, and 3. The source text in the form of characters converts through Table 1-3 into an associated index. Wherein, the own vocabulary includes 3,000 words (typically for conversation between two persons needs 2,000-3,000 words); 40 codes (commands) indexes; 50 new (composite) words. These new 50 words, found in written conversation between two persons are collected and saved in the temporary file (not shown). The never used words in the own vocabulary (Index column Counter i=0) are replaced by 50 new words and then information in the temporary file will be cleaned. This process is looping until 3000 old words will be replaced. In the present embodiment each index in the randomly order represents the source text's word only once during one cycle of utilizing all 65,000 indexes sees as, an example, one row in the Table 1a. Wherein, the first column keeps words/indexes of universal vocabulary, second one is a column's index counter and the last 1-3 index columns represent 16 bit length randomly indexes. Table 1a, 1b, 2, and 3 demonstrates step of replacing randomly indexes for Index column i=4.

TABLE 1a

| Universal vocabulary | | Index Column | Index Column (i) | | |
|---|---|---|---|---|---|
| Word | Index | (i) Counter | 1 | 2 | 3 |
| people | 982 | i = 3 | 545 | 130 | 5 |

TABLE 1b

| Universal vocabulary | | Index Column | Index Column (i) | | |
|---|---|---|---|---|---|
| Word | Index | (i) Counter | 1 | 2 | 3 |
| people | 982 | i = 1 | 6164 | 513 | 87 |

TABLE 2

| Reserve indexes for column i = 4 | 6164 | 513 | 87 | 40,000 randomly indexes | 545 | 130 | 5 |
|---|---|---|---|---|---|---|---|

TABLE 3

| 545 |
|---|
| 6164 |

The preferred embodiment of text compression described in detail by following steps:
Steps 1 to 6 the same as for FIG. 4.
7. Find symbol's index
7.1 If symbol found in main section of first temporary vocabulary then
7.1.1 Read IndexColumn(i) counter
7.1.2 Increment IndexColumn(i) counter for 7.1.1 i=i+1
7.1.3 If i<=3
7.1.3.1 Find symbol's index (i) for column 7.1.1 in table 1a
7.1.3.2 Make pseudo-code by merging indicator to index 7.1.3.1
7.1.3.3 Output 7.1.3.2 to main pseudo-code storage 6 and Go to 5.
7.1.4 If i=4
7.1.4.1 Move 3 indexes from table 1a to the end of the reserved indexed vocabulary for column (i) (table 2)
7.1.4.2 Move $1^{st}$ index from table 1a and $1^{st}$ index from reserved indexes vocabulary to table 3
7.1.4.3 Replace first 3 indexes in table 1a by first 3 indexes from reserved vocabulary (table 2) for column (i) (table 1b)
7.1.4.4 Reset IndexColumn(i) counter to 1
7.1.4.5 Find symbol's index (i) for column 7.1.4 in table 1b
7.1.4.6 Make pseudo-code by merging indicator 6.3 to index 7.1.4.5
7.1.4.7 Output 7.1.4.6 to main pseudo-code storage 6
7.1.4.8 Go to 5.

It is understood that exemplary of the text compression based on described herein method may be implemented in variety of different applications, including: transmission text in the form of root of tree and main vocabulary indexes and pseudo-codes wherein those indexes have the same transmission 14 bit length (as a fact most data is encoded in seven bits and is stored in 8 bits length); root of tree and main words are converted into indexes through the same index table; the 10-12 bit length randomly index table utilized for composition words; randomly index table 2 utilizes by smart credit cards: wherein smart credit card includes the public open plaintext data and randomly indexes (ciphertext data) presented in the table 2; additionally compressing the compressed target text by utilizing "compression algorithms, such as Huffman, LZW, arithmetic and hundreds of other variants of the above techniques which usually exploit statistical redundancy of the English letters" see U.S. Pat. No. 8,332,209.

The differences between current method of creating payment card application, which is "based on the Smartcard Access Control an integrated circuit microprocessor designed specifically for smart card applications; there are certain arithmetic operations, such as modular exponentiation and modular multiplication, which are common to a variety of public key algorithms; implements a set of commands which support card maintenance, key management, user authentication, data storage, and data encryption and authentication. Access control software running on a host computer issues commands to the smartcard through the reader/writer interface. The firmware of the card then executes the requested function and returns the appropriate response to the host computer. It is the responsibility of the host access control software to mediate the authentications between the user, the user's smartcard, and the host computer; both the Digital Signature Algorithm (DSA), which has been proposed by NIST as a Digital Signature Standard (DSS) [24], and the Rivest-Shamir-Adleman (RSA) [25] cryptographic algorithm have been implemented . . ." [8], and present method of creating payment card application are: storing the identical randomly index (ciphertext data) in the table 2 on the host computer and payment card, wherein stealing information from payment card eliminates by the process of rotating the stored in the table 2 at least two randomly indexes (quantity of stored indexes dependant oh frequency using payment card); one way transmitting to host computer the public information (constant parameter) and private replaceable index (variable parameter); matching its transmitting information with stored in the host computer information; transmitting back the success results of matched indexes to the user; storing an integrated circuit on the payment card, wherein the integrated circuit includes memory, frequency generator, logic scheme with output switches, contact or contactless interfaces such as serial port, RF, and LED; connecting power to conductor's magnet stripe through output switches.

What is claimed is:

1. A computer system for compressing and decompressing text comprising:
storage for storing a processor, counter and memory for performing the steps of
reading the source text and creating the compressed target text;
storage for storing the universal permanent reference vocabulary;
storage for storing the compressed text;
wherein the compressed text includes:
section of sequential flow indexes;
section of sequential flow pseudo-codes;
storage for storing codes;
storage for storing a randomly index table;
temporary file for storing a source text in the form of characters;
file for storing a first temporary vocabulary;
wherein creating a first temporary vocabulary comprises:
merging index section to words content in specific vocabulary section;
merging a randomly index table to words content in specific vocabulary section;
files for split a first temporary vocabulary into root of tree index section and pseudo-code section;
file for storing a second temporary vocabulary;
wherein temporary storing a repeating indexes in the second temporary vocabulary;
temporary file for storing a counting parts of group of repeating indexes;
assigning a pointed code to the first index in the sequence of compressed target text;
output repeating indexes into the second temporary vocabulary.

2. A non-transitory computer readable media of claim 1, wherein creating the first temporary vocabulary comprises:
merging an index table section with words content in specific vocabulary sections.

3. A non-transitory computer readable media of claim 1, wherein creating the second temporary vocabulary comprises:
reading a source text;
converting symbols into indexes through a root of tree word/index vocabulary and first temporary vocabulary;
counting repeating indexes;
counting parts of group of repeating indexes;
assigning a pointed code to the first index in the sequence of compressed target text;
output repeating indexes into the second temporary vocabulary.

4. A non-transitory computer readable media of claim 1, wherein creating the pseudo-code comprises:
merging indicator to main symbol's index;
merging indicator to root of tree symbol's index;
arranging sequence of root of tree symbol's indexes and main symbol's pseudo-codes for storage and transmission;
arranging sequence of root of tree symbol's pseudo-code and main symbol's index for storage and transmission.

5. A non-transitory computer readable media storing a program, wherein the program instructs a processor to perform the steps for a method for compressing and decompressing text, comprising:
creating a universal permanent vocabulary,
wherein the universal vocabulary is a redundant vocabulary including:
section of commonest word/indexes using for all applications;
sections of words using for literature, TV, papers, magazines, specific and professional applications and creating in advance;
section of the own vocabulary taken symbols e.g. slangs from written conversation between two persons, group of people, between people in an organization and creating during process of text compression and decompression text;
creating index table section;
in each section of the universal vocabulary organizing symbols:

in alphabetic order, length of characters belong to symbol, quantity of spaces and punctuation marks, and unique group of characters represented word itself;
searching of symbols in the universal vocabulary based on the following rules:
alphabetic order;
length of characters belongs to symbol;
quantity of spaces and punctuation marks;
and unique group of characters;
splitting the universal vocabulary into two sections, which include a root of tree word/index section and main word section;
creating a first temporary vocabulary containing;
creating identical a first temporary vocabulary on receiver side during process of decompressing text;
creating a second temporary vocabulary during process of compressing text;
creating identical a second temporary vocabulary on receiver side during process of decompressing text;
creating a pseudo-code by merging indicator to index;
recovering transmitted compressed text in the form of indexes into corresponding symbols in form of characters using as reference the first and second temporary vocabularies;
wherein creating the identical second temporary vocabulary on the receiver side during process of decompressing the compressed text comprises:
reading the compressed text;
finding assigning a pointed code for repeating indexes in the compressed text;
output repeating indexes into the second temporary vocabulary;
additionally compressing the compressed target text by utilizing LZW compression algorithms or other relatively techniques.

6. A method for compressing and decompressing text, comprising:
creating a universal permanent reference vocabulary in a computer database, said universal permanent reference vocabulary comprising a root of tree section, said main section comprising and at least one specialized subsection;
creating a first temporary vocabulary in a computer database on a sender side, said first temporary vocabulary comprising an index table, a root of tree section, a main section and at least one specialized subsection;
creating a pseudo-code for each word found in the first temporary vocabulary, said pseudo-code comprising an indicator and an index;
encoding a text using the pseudo-codes for each word and using a computer network to transmit the encoded text to a receiver;
creating a copy of the first temporary vocabulary on the receiver side in a computer database;
using a computer to decode the text using the copy of the first temporary vocabulary and the index table.

7. The method of claim 6, further comprising:
creating a second temporary vocabulary in a computer database on the sender side, said second temporary vocabulary comprising a list of words that are repeated at least once in the text;
creating a pseudo-code for each word in the second temporary vocabulary, said pseudo-code comprising an indicator and an index;
creating a copy of the second temporary vocabulary on the receiver side;
using a computer to decode the text using the copy of the second temporary vocabulary, the copy of the first temporary vocabulary, and the index table.

8. The method of claim 6, wherein the at least one specialized subsection is selected from a group comprising:
frequently-used words in a conversation;
frequently-used words in the English language;
words used in literature;
words used in a professional discipline.

* * * * *